US007269484B2

(12) United States Patent
Hein

(10) Patent No.: US 7,269,484 B2
(45) Date of Patent: Sep. 11, 2007

(54) VEHICULAR TOUCH SWITCHES WITH ADAPTIVE TACTILE AND AUDIBLE FEEDBACK

(75) Inventor: David A. Hein, Sterling Heights, MI (US)

(73) Assignee: Lear Corporation, Southfield, MI (US)

( * ) Notice: Subject to any disclaimer, the term of this patent is extended or adjusted under 35 U.S.C. 154(b) by 560 days.

(21) Appl. No.: 10/938,022

(22) Filed: Sep. 9, 2004

(65) Prior Publication Data
US 2006/0052907 A1  Mar. 9, 2006

(51) Int. Cl.
*G09G 5/00* (2006.01)
*B60Q 1/00* (2006.01)
*G06F 19/00* (2006.01)

(52) U.S. Cl. .............................. 701/1; 701/36; 341/27; 340/996

(58) Field of Classification Search ............... 701/1, 701/29, 35, 36; 341/27, 32; 340/438, 461, 340/996; 345/156, 173; 307/9.1, 10.1; 381/71.4, 381/86; 455/77
See application file for complete search history.

(56) References Cited

U.S. PATENT DOCUMENTS

| 4,896,370 | A | * | 1/1990 | Kasparian et al. ............ 455/77 |
| 5,767,457 | A | | 6/1998 | Gerpheide et al. |
| 5,977,867 | A | | 11/1999 | Blouin |
| 6,819,990 | B2 | * | 11/2004 | Ichinose ....................... 701/36 |
| 6,885,361 | B1 | * | 4/2005 | Harvill et al. ............... 345/156 |
| 7,138,727 | B2 | * | 11/2006 | Hein et al. .................... 307/9.1 |
| 2002/0084721 | A1 | | 7/2002 | Walczak |
| 2003/0179190 | A1 | | 9/2003 | Franzen |
| 2004/0201578 | A1 | * | 10/2004 | Sadahiro ...................... 345/173 |
| 2007/0080951 | A1 | * | 4/2007 | Maruyama et al. ......... 345/173 |

FOREIGN PATENT DOCUMENTS

| EP | 1418673 | 5/2004 |
| GB | 2409523 | 6/2005 |
| WO | WO 2003/080391 | 10/2003 |
| WO | WO 2004/053661 | 6/2004 |

* cited by examiner

*Primary Examiner*—Tan Q. Nguyen
(74) *Attorney, Agent, or Firm*—MacMillan, Sobanski & Todd, LLC

(57) ABSTRACT

A manual control system for a vehicle includes a touch sensitive input element actuatable in response to proximity of a user's appendage. A tactile feedback generator produces a perceptible tactile stimulus. An audible feedback generator produces a perceptible audible stimulus. A sound level characterizer generates a sound characterization signal indicative of a sound-related parameter of the vehicle. A controller generates a feedback event in response to an actuation of the input element. The controller includes the perceptible tactile stimulus and the perceptible audible stimulus in the feedback event according to the sound characterization signal.

20 Claims, 2 Drawing Sheets

VEHICULAR TOUCH SWITCHES WITH ADAPTIVE TACTILE AND AUDIBLE FEEDBACK

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to vehicular control panels, and, more specifically, to generating tactile and audible feedback to a user in connection with touch switches used as input elements with no moving parts.

Control panels are provided in motor vehicles for controlling various vehicle systems and accessories such as lighting, wipers, climate control (HVAC) systems, audio systems, navigation systems, and the like. The panels may be mounted to an instrument panel (i.e., dashboard), front or rear console, steering wheel, or other vehicle trim components. Manual input elements contained on the panels are associated with various user-controlled functions such as blower fan speed, audio volume, radio tuning, and the like.

In the past, the control elements were typically implemented as mechanical pushbutton or rotary switches. With increasing electronic content in vehicles, however, there is an increasing use of control elements without moving parts. Touch sensitive or proximity switches may use various technologies to detect a user request for a control action by sensing the presence of a user's appendage (e.g., finger) adjacent to a target area on the control panel. Typically, a touch switch generates some kind of a field, which is disturbed or modified by the user's finger. Such fields include an electric field used in a capacitive touch switch or a light beam in an optical switch. A capacitive switch is disclosed in co-pending U.S. application Ser. No. 10/812,223, filed Mar. 29, 2004, entitled "Touch Pad Sensor For Motor Vehicle", which is incorporated herein by reference in its entirety.

Touch sensitive switches have significant advantages over mechanical switches. Mechanical linkages require the front fascia of a control panel to include apertures for accommodating mechanical switches. Resulting gaps between the fascia and the switches cause sealing problems, for example. Moreover, mechanical parts are subject to wear and are more easily broken. Touch sensitive switches provide an improved visual appearance, are cost effective, and achieve better durability and environmental performance.

Since there are no moving parts in a touch sensitive switch, the user does not get the same tactile feedback that is inherent in the movement of a mechanical switch. Therefore, it is known to provide control panels with a supplemental feedback generator to confirm to the user that a switch function has been activated. A stimulus such as an audible tone or beep or a tactile vibration may be generated when a manual switch activation is sensed.

The ambient environment in an automobile or other transportation vehicle is very dynamic in terms of background noise levels. The interior of a vehicle is typically much noisier while moving than when parked because of road and wind noise. Other noise factors include the status of vehicle closures such as a window or a sunroof, the speed of blower fans, and the volume setting of an audio system. The effectiveness of prior art switch feedback provided to the user of a touch sensitive switch has been limited because of the background noise levels. Feedback that is perceptible under all conditions may give the impression of low quality under quiet conditions.

SUMMARY OF THE INVENTION

The present invention has the advantage of providing an optimized feedback event that is coordinated with the noise environment of the vehicle.

In one aspect of the invention, a manual control system for a vehicle comprises an input element actuatable in response to proximity of a user's appendage. A tactile feedback generator produces a perceptible tactile stimulus. An audible feedback generator produces a perceptible audible stimulus. A sound level characterizer generates a sound characterization signal indicative of a sound-related parameter of the vehicle. A controller generates a feedback event in response to an actuation of the input element. The controller includes the perceptible tactile stimulus and the perceptible audible stimulus in the feedback event according to the sound characterization signal.

DETAILED DESCRIPTION OF PREFERRED EMBODIMENTS

Known user interface panels attempt to strike a balance between audible and tactile feedback. Audible feedback has been designed such that it can be heard over normal vehicle noises during normal driving conditions of the vehicle. Because of this, the audible feedback tends to be too loud for a quiet (e.g., parked) vehicle. In prior systems employing tactile feedback, the extraneous sounds associated with generating the tactile feedback become especially noticeable in a quiet vehicle and reduce the impression of product quality. The present invention eliminates the perceived quality issues created by tactile feedback generators in a quiet environment while providing a strong (i.e., stiff) tactile feedback in a loud vehicle. The invention further prevents audible feedback from being too loud in a quiet vehicle.

Figure 1:
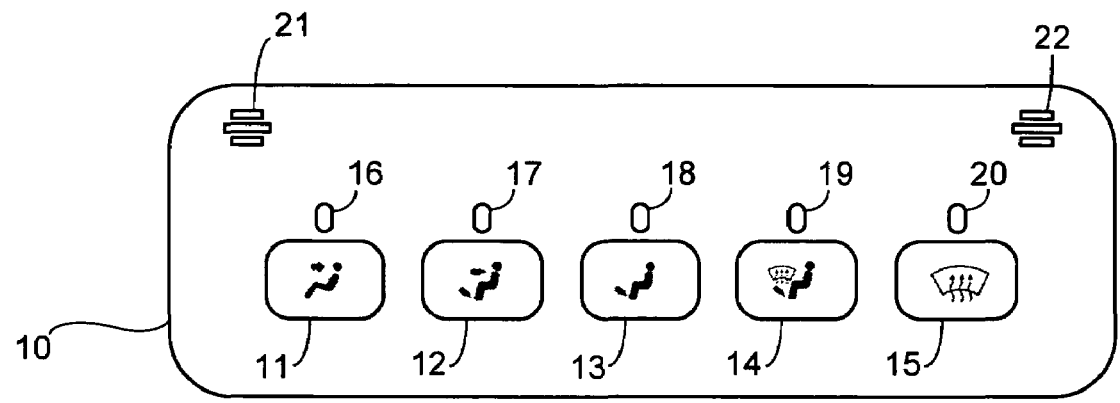
FIG. 1 is a front, plan view of a control panel of the present invention.

A control panel 10 of the present invention is shown in FIG. 1. A plurality of input elements 11-15 (such as touch sensitive or field disturbance sensors) are provided for controlling respective functions, such as climate control damper positions for directing air flow within a vehicle. Status lights 16-20 are provided in association with touch sensitive input elements 11-15 so that the currently selected function may be indicated. Status lights 16-20 may be comprised of light emitting diodes (LEDs). Each status light represents the status of a respective bi-state function (e.g., whether a corresponding damper position is selected or whether a defrost element is turned on).

Control panel 10 includes a transducer 21 for providing a perceptible audible stimulus such as a tone for generating feedback during activation of an input element. Transducer 21 may also provide a perceptible tactile stimulus when driven at a lower frequency, as will be described below. A microphone 22 is provided in certain embodiments of the invention for characterizing a sound-related parameter of the vehicle.

Control panel 10 includes graphical icons to identify target areas for placing one's finger in order to activate a corresponding function. When a finger is detected in the target area and the corresponding function is implemented, a feedback event is generated to acknowledge to the user that the desired function has been successfully achieved.

Figure 2:
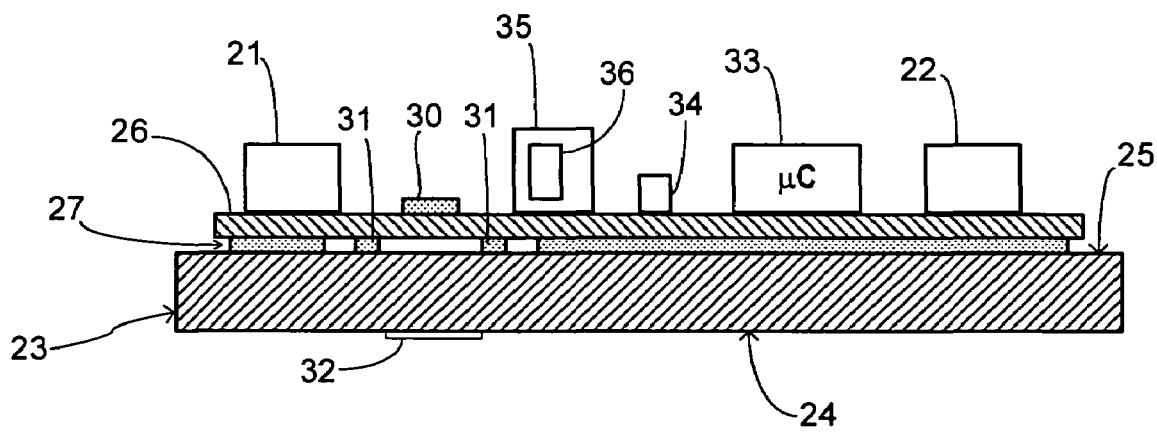
FIG. 2 is a side view of a control panel of the present invention.

A preferred embodiment employing a capacitive sensor for implementing a touch sensitive switch is shown in FIG. 2. Control panel 10 includes a front fascia 23 having a front face 24 and a rear face 25. A printed circuit board 26 is arranged adjacent rear face 25. Other housing components (not shown) are used to form an electronic module as known in the art. An electrode layer 27 may be formed between rear face 25 and printed circuit board 26. Layer 27 may be comprised of conductive traces deposited on printed circuit board 26, for example. Electrode layer 27 could alternatively be located on the opposite side of printed circuit board 26. In either embodiment, printed circuit board 26 acts as a portion of a dielectric for forming capacitive sensors. A first sensor (i.e., touch sensitive input element) includes an electrode 30 on one side of board 26 and electrode 31 (e.g., tracing a circle) on the other side. Alternatively, both electrodes could be on the same side of board 26. A target area graphic 32 on front face 24 of fascia 23 is aligned with electrodes 30 and 31 so that a user's appendage such as a finger brought into target area 32 modifies the capacitance of the capacitor formed by electrodes 30 and 31 (i.e., the finger disturbs an electric field of the capacitor). A detector circuit (known shown) couples electrodes 30 and 31 to a microcontroller 33. A detector circuit as described in prior U.S. application Ser. No. 10/812,223 may be used. When a finger or other appendage is detected proximate to the target area, a signal is provided to microcontroller 33 identifying the particular switch that has been actuated. Microcontroller 33 generates an appropriate control signal to be provided to the actuator or other control system that corresponds to the desired function. In order to provide feedback of the particular functional status, an LED 34 may be illuminated to provide a constant visual status of the function. In addition, a feedback event is generated which may include an audible stimulus from transducer 21 or a tactile stimulus from a tactile generator 35 mounted to printed circuit board 26. The tactile stimulus may be comprised of a series of vibrations or a single impulse, for example. Tactile generator 35 includes a moving mass 36 which may comprise an unbalanced mass for rotating to produce vibrations or a plunger for impacting a fixed structure to generate an impulse.

In one preferred embodiment, a single integrated device may be used as both the tactile generator and the sound transducer. An electromagnetic transducer (similar to a subwoofer coil) may be mechanically coupled to fascia 23. When driven at a low rate (e.g., a sub-audible frequency), a tactile stimulus is generated. When driven at a higher rate, an audible tone is generated with fascia 23 acting as a speaker cone.

Figure 3:
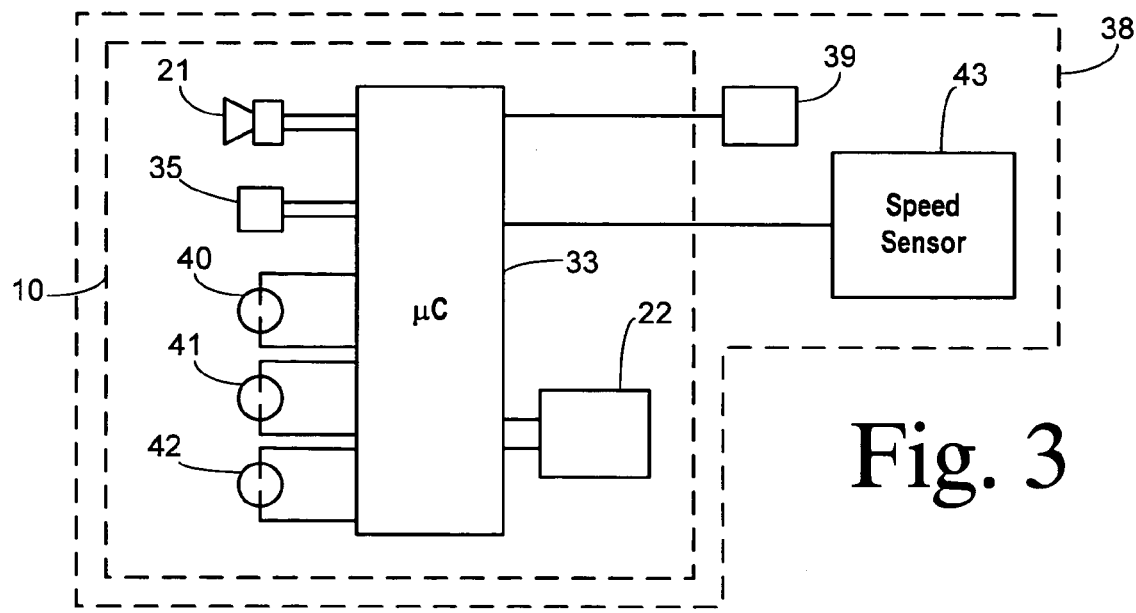
FIG. 3 is a schematic, block diagram of the invention.

The present invention is shown schematically in FIG. 3. Control panel 10 is mounted in a vehicle 38 for controlling a vehicle accessory 39. Microcontroller 33 is coupled to touch sensitive switch elements 40-42 for detecting a user's appendage. An audible feedback generator such as transducer 21 and a tactile feedback generator 35 produce a feedback event which may include both a perceptible tactile stimulus and a perceptible audible stimulus depending upon the noise conditions of the vehicle as determined by a sound level characterizer. The sound level characterizer is implemented using a sensor (such as microphone 22 or a speed sensor 43) in cooperation with microcontroller 33. The acoustic environment of the vehicle is dynamically characterized by generating a sound characterization signal that is indicative of a sound-related parameter of the vehicle such as vehicle speed, ambient background noise, volume level of the audio system, or other variables. In certain embodiments, the sound characterization signal may be directly obtained from the sound-related parameter such as vehicle speed. In other embodiments, the sound characterization signal may be derived as a qualitative measure based on one or more sound-related parameters. Based on the characterization signal, microcontroller 33 includes either the perceptible tactile stimulus or the perceptible audible stimulus (or both at varying levels) in the feedback event as appropriate.

Figure 4:
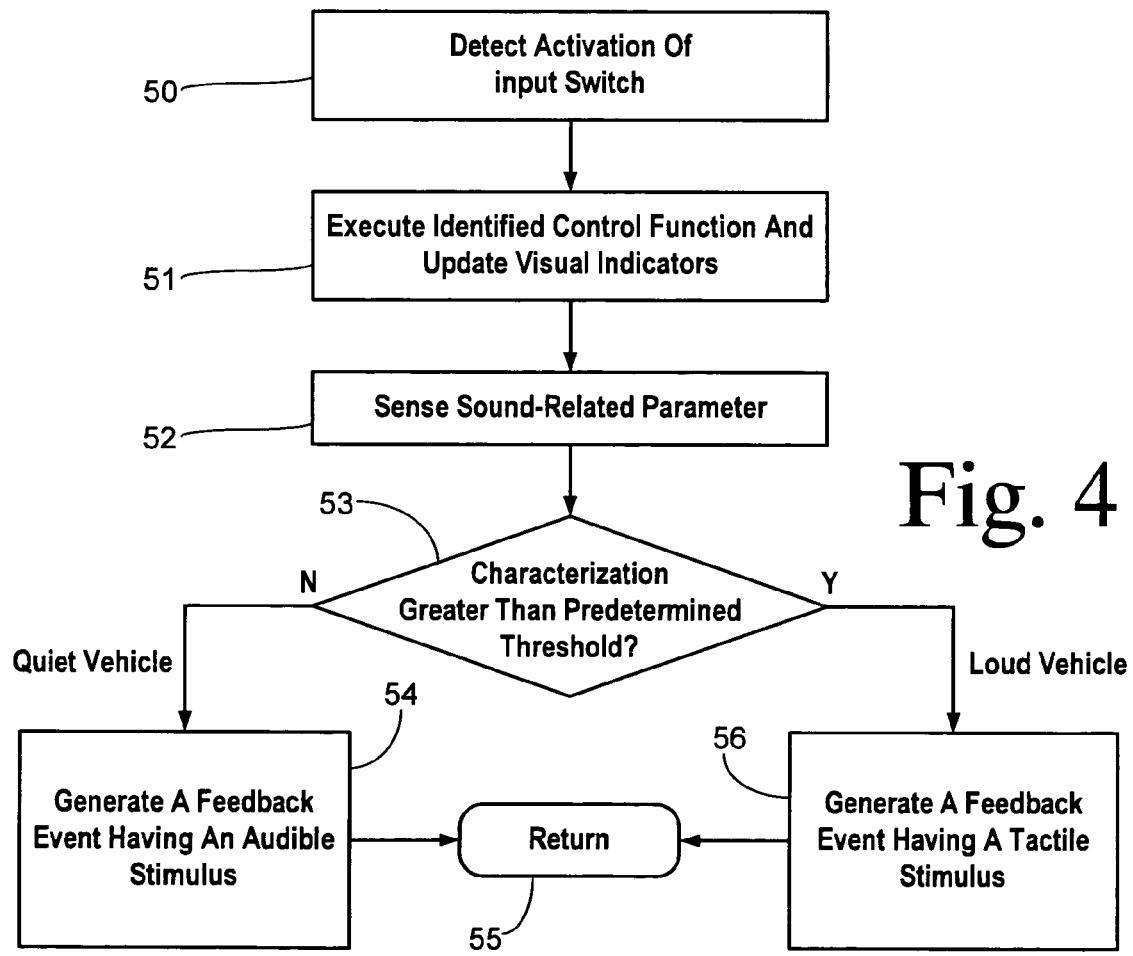
FIG. 4 is a flowchart of a preferred embodiment of a method of the present invention.

A first preferred embodiment of the invention operates according to the method shown in FIG. 4. In step 50, an activation of an input (e.g., touch sensitive) switch is detected. The identified control function is executed in step 51 and visual indicators (if any) are updated to show the status of the control function. In step 52, a sound-related parameter is sensed.

In step 53, a sound characterization signal (e.g., either the sound-related parameter itself or a signal based thereon) is compared to a predetermined threshold and a check is made to determine whether the sound characterization signal is greater than the predetermined threshold. In one preferred embodiment, the predetermined threshold is selected at an appropriate magnitude for differentiating between a quiet vehicle and a loud vehicle. If the sound characterization signal is not greater than the predetermined threshold and a quiet vehicle is identified, then a feedback event is generated in step 54 comprising an audible stimulus. In one embodiment, the feedback event includes an audible stimulus only. In alternative embodiments, the feedback event may be primarily an audible stimulus with a small amount of tactile stimulus. Then a return is made in step 55 to wait for the next detection of switch activation. If the sound characterization signal is determined to be greater than the predetermined threshold in step 53, then a feedback event is generated in step 56 having a tactile stimulus. In one embodiment, the feedback event includes a tactile stimulus only. In alternative embodiments, the feedback event may be primarily a tactile stimulus with a small amount of audible stimulus. Then a return is made in step 55 to wait for the next switch activation.

The embodiment employing either an audible stimulus alone or a tactile stimulus alone simplifies the associated hardware since each respective stimulus only needs to be generated at one particular strength magnitude and since one device can be used to generate either kind of stimulus. In alternative embodiments, variable levels of the audible and/or tactile stimuli can be utilized according to the magnitude of the sound characterization signal. Thus, in a quiet vehicle a feedback event may include an audible tone together with a light tactile stimulus while in a loud vehicle the feedback event includes no audible tone, but a tactile stimulus at a harder, higher magnitude. Alternatively, only an audible tone could be generated in the quiet vehicle while both a tactile stimulus and a louder audible tone are generated in a loud vehicle.

In another embodiment, more than one threshold is used for differentiating between a plurality of distinct noise environments each having a respective feedback event made up of audible and/or tactile stimuli of varying strengths. For example, a very quiet environment characterized by a sound-related parameter value below a first threshold initiates a feedback event having only an audible stimulus. In a medium environment characterized by the sound-related parameter being between the first threshold and a second higher threshold, both an audible stimulus and tactile stimulus are included in the feedback event. In a loud environment having the sound-related parameter greater than the second threshold, the feedback event comprises just the tactile stimulus. The characterization of the sound level using multiple thresholds may for ex ample comprise identifying vehicle speed relative to first and second speed thresholds. In addition, the categorization may also depend upon the status of vehicle closures, such as a window or a sunroof. Thus, a speed of over 25 mph with the windows open may be characterized as a loud environment while a speed of 35 mph or less with the windows closed may be characterized as a moderate environment. In other words, variable speed thresholds may be employed which depend upon other sensed variables.

In an embodiment employing direct measurement of background noise level using a microphone, one or more thresholds for characterizing the sound environment are preferably employed. An inexpensive piezo electric microphone is preferably employed since only gross sound levels need to be sensed.

In yet another embodiment, a continuous spectrum of feedback events may be controlled according to a sound characterization signal without relying on fixed thresholds. For example, a sound characterization signal such as a vehicle speed signal, or a measured sound level may be used to generate an audio volume for an audible feedback stimulus using a predetermined gain function. Thus, by adapting the volume of the audible feedback to sound-related parameters of the vehicle, an audible feedback that is too loud in a quiet vehicle is avoided. Likewise, the intensity of tactile feedback can be adapted to the noise and overall vibratory environment of the vehicle so that a control panel provides an impression of higher quality to the user.

What is claimed is:

1. A manual control system for a vehicle, comprising:
   an input element actuatable in response to proximity of a user's appendage;
   a tactile feedback generator for producing a perceptible tactile stimulus;
   an audible feedback generator for producing a perceptible audible stimulus;
   a sound level characterizer generating a sound characterization signal indicative of a sound-related parameter of said vehicle; and
   a controller for generating a feedback event in response to an actuation of said input element, said controller including said perceptible tactile stimulus and said perceptible audible stimulus in said feedback event according to said sound characterization signal.

2. The system of claim 1 wherein said controller compares said sound characterization signal with a predetermined threshold and selects a feedback event comprising said perceptible audible stimulus without said perceptible tactile stimulus in response to a first comparison result.

3. The system of claim 2 wherein said controller selects a feedback event comprising said perceptible tactile stimulus without said perceptible audible stimulus in response to a second comparison result.

4. The system of claim 1 wherein said controller compares said sound characterization signal with a predetermined threshold, wherein said controller selects a feedback event comprising both said perceptible audible stimulus and said perceptible tactile stimulus in response to a first comparison result, said perceptible tactile stimulus being generated with a first predetermined magnitude, and wherein said controller selects a feedback event comprising said perceptible tactile stimulus without said perceptible audible stimulus in response to a second comparison result, said perceptible tactile stimulus being generated with a second predetermined magnitude greater than said first predetermined magnitude.

5. The system of claim 1 further comprising:
   a visual feedback element associated with said input element and coupled to said controller, wherein said input element controls a bi-state function within said vehicle, wherein said visual feedback element has first and second visual states, and wherein said feedback event further includes updating said visual state of said visual feedback element.

6. The system of claim 1 wherein said tactile feedback generator and said audible feedback generator are comprised of an integrated transducer which generates said perceptible tactile stimulus when driven at a first rate and which generates said perceptible audible stimulus when driven at a second rate higher than said first rate.

7. The system of claim 1 wherein said tactile feedback generator comprises a moving mass mechanically coupled to said input element.

8. The system of claim 1 wherein said tactile feedback generator comprises an electromagnetically operated plunger.

9. The system of claim 1 wherein said audible feedback generator comprises a sound transducer and wherein said perceptible audible stimulus comprises a predetermined tone.

10. The system of claim 9 wherein said predetermined tone has a volume level controlled by said controller in response to said sound characterization signal.

11. The system of claim 1 wherein said sound-related parameter is comprised of a speed of said vehicle.

12. The system of claim 1 wherein said sound-related parameter is comprised of a measured noise level within said vehicle.

13. The system of claim 1 wherein said sound-related parameter is comprised of a status of a body closure of said vehicle.

14. The system of claim 1 comprising a control panel including a plurality of input elements.

15. The system of claim 14 comprising a plurality of respective tactile feedback generators for producing respective perceptible tactile stimuli.

16. A method of controlling user feedback in a manual control system of a vehicle, said method comprising the steps of:
   sensing a sound-related parameter of said vehicle;
   sensing a manual activation of an input element of said manual control system; and
   generating a feedback event upon said manual activation, said feedback event including a selected tactile stimulus or a selected audible stimulus in response to said sound-related parameter.

17. The method of claim 16 further comprising the step of:
comparing said sound-related parameter with a predetermined threshold;
wherein said feedback event comprises said selected audible stimulus without said selected tactile stimulus in response to said sound-related parameter being less than said predetermined threshold.

18. The method of claim 16 further comprising the step of:
comparing said sound-related parameter with a predetermined threshold;
wherein said feedback event comprises said selected tactile stimulus without said selected audible stimulus in response to said sound-related parameter being greater than said predetermined threshold.

19. The method of claim 16 wherein said sound-related parameter is comprised of a speed of said vehicle.

20. The method of claim 16 wherein said sound-related parameter is comprised of a measured noise level within a passenger cabin of said vehicle.

* * * * *